United States Patent [19]

Nakahata et al.

[11] Patent Number: 5,160,869
[45] Date of Patent: Nov. 3, 1992

[54] SURFACE ACOUSTIC WAVE DEVICE

[75] Inventors: Hideaki Nakahata; Naoji Fujimori, both of Itami, Japan

[73] Assignee: Sumitomo Electric Industries Ltd., Osaka, Japan

[21] Appl. No.: 634,321

[22] Filed: Dec. 26, 1990

[30] Foreign Application Priority Data

Dec. 26, 1989 [JP] Japan .................................. 1-339521

[51] Int. Cl.$^5$ .............................................. H01L 41/08
[52] U.S. Cl. .............................................. 310/313 A
[58] Field of Search ....................... 310/313 A, 313 R; 333/150, 151, 154, 155, 193

[56] References Cited

U.S. PATENT DOCUMENTS

| | | | |
|---|---|---|---|
| 4,571,519 | 2/1986 | Kawabata et al. | 310/313 A |
| 4,752,709 | 6/1988 | Fujishima et al. | 310/313 A |
| 4,952,832 | 8/1990 | Imai et al. | 310/313 A |

FOREIGN PATENT DOCUMENTS

| | | | |
|---|---|---|---|
| 0363495 | 4/1990 | European Pat. Off. | |
| 0197912 | 11/1983 | Japan | 310/313 A |
| 0124112 | 7/1985 | Japan | 310/313 A |
| 01062911 | 3/1989 | Japan | |
| 0020910 | 1/1990 | Japan | 310/313 A |
| 0137413 | 5/1990 | Japan | 310/313 A |
| 0239715 | 9/1990 | Japan | 310/313 A |

*Primary Examiner*—Mark O. Budd
*Attorney, Agent, or Firm*—Cushman, Darby & Cushman

[57] ABSTRACT

A surface acoustic wave device which comprises a diamond or diamond-like carbon layer, a ZnO piezoelectric layer and a comb-like electrode and has a structure having a large surface wave propagation velocity and a large electromechanical coupling factor which are achieved by defining a thickness of the ZnO layer and a mode.

12 Claims, 13 Drawing Sheets

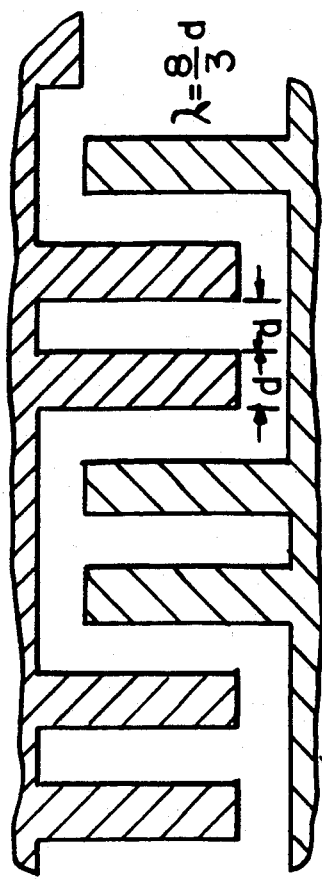
Fig. 1.
Fig. 2.
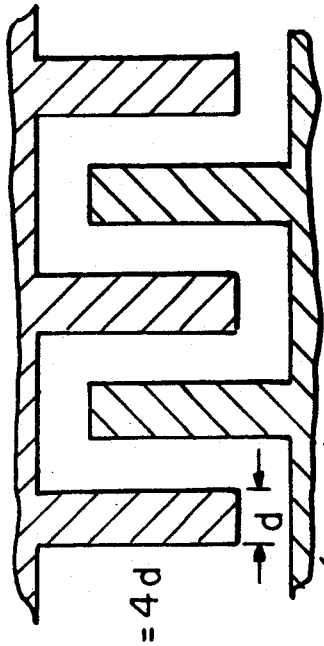
Fig. 3.
TYPE I
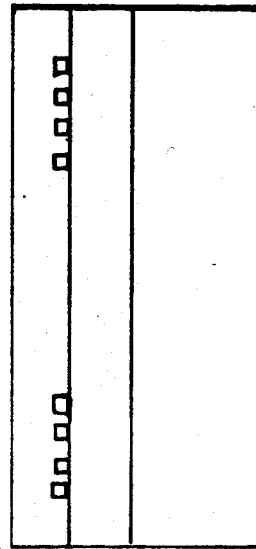
Fig. 5.
TYPE III
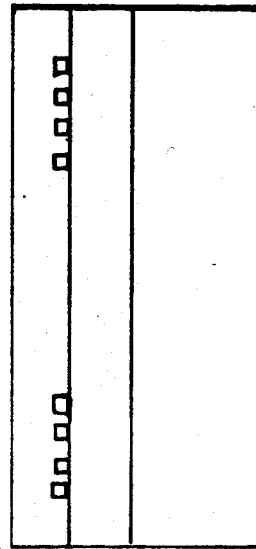
Fig. 4.
TYPE II
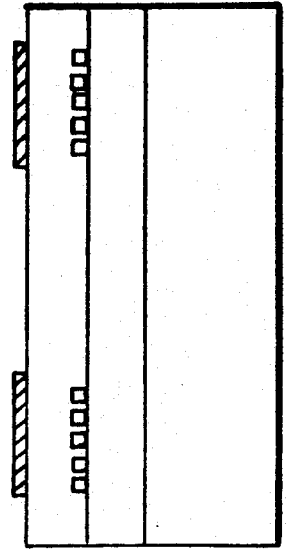
Fig. 6.
TYPE IV
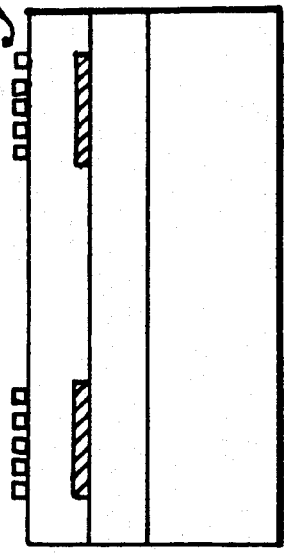

$\frac{2\pi}{\lambda}HD = 1.0$ $\frac{2\pi}{\lambda}HD = 2.0$

SURFACE ACOUSTIC WAVE DEVICE

BACKGROUND OF THE INVENTION

1. Field of the Invention

The present invention relates to a surface acoustic wave device which operates in a high frequency range of from several hundred MHz to GHz band.

2. Description of the Related Art

Since a surface acoustic wave device utilizing a surface acoustic wave which propagates with energy concentrated on a surface of a solid material is a compact and stable device, it is practically used as an intermediate frequency filter in a TV set and the like.

The surface acoustic wave device is usually excited by applying an alternating electric field on a piezoelectric material with comb-like electrodes.

As the piezoelectric material, bulk single crystals such as $LiNbO_3$, $LiTaO_3$, etc. or a ZnO thin film which is vapor deposited on a substrate is used. Currently, a surface acoustic wave device which comprises a single crystal piezoelectric material, or a ZnO piezoelectric material formed on a glass plate or a sapphire plate is practically used.

In general, an operation frequency f of the surface accustic wave device is determined by the equation: $f = v/\lambda$ in which is a propagation velocity of the surface acoustic wave and $\lambda$ is a wavelength. The wavelength $\lambda$ is determined from a period of the comb-like electrode as shown in FIGS. 1 and 2. In FIG. 1, electrode tips each having a width d are integrally formed with a distance 3d. A pair of adjacent electrode tips are of the different electrodes and every other electrode tips are of the same electrodes. The comb-like electrode of FIG. 1 is one of the most commonly used electrodes. The wavelength with this type of electrodes is 4d.

In the comb-like electrode of FIG. 2, two electrode tips each having a width d are repeatedly arranged with a distance 5d. The wavelength $\lambda$ is 8d/3. With the comb-like electrode of FIG. 2, a three-times mode is strongly excited.

The propagation velocity v depends on the piezoelectric material or the substrate material and also on the mode of surface acoustic wave.

When the single crystal piezoelectric material made of $LiNbO_3$ is used, the propagation velocity v is from 3500 to 4000 m/sec., and when that made of $LiTaO_3$ is used, the propagation velocity v is from 3300 to 3400 m/sec. When the piezoelectric material comprising the ZnO thin film formed on the glass plate is used, the propagation velocity v is at most 3000 m/sec.

To increase the operation frequency f, the propagation velocity v is increased and/or the wavelength $\lambda$ is decreased. However, the propagation velocity v is limited by the characteristics of the material. The period size of the comb-like electrode has a lower limit due to limitation of fine processing technique. By the photolithography, the lower limit of the period size is 1.2 $\mu$m. With the electron beam exposure, the processing to submicron order is possible. However, the line width becomes smaller, an yield becomes worse. That is, because of the limitation of the processing technique, the wavelength $\lambda$ cannot be reduced significantly.

By the above reasons, the operation frequency of the practically used surface acoustic wave device is at most 900 MHz, and one having the operation frequency larger than 900 MHz has not been widely produced.

By the way, as the frequency in the telecommunication such as satellite telecommunication or mobile telecommunication is increased, it is increasingly required to provide a surface acoustic wave device which can be used in a high frequency range (GHz band), and development of such surface acoustic wave device is being made vigorously.

In general, to apply the piezoelectric thin film grown on the substrate in the surface acoustic wave device, when the sound velocity through the substrate is larger than that through the piezoelectric material, plural surface acoustic waves having different propagation velocities (zeroth order mode, first order mode, second order mode and so on from the wave having the smaller propagation velocity) are generated.

When the sound velocity through the substrate material is larger, the propagation velocity v becomes larger.

Of course, the propagation velocity v of the surface acoustic wave and the sound velocity through the substrate material are in the different concepts and have different values. However, since the thin piezoelectric layer is formed on the substrate, the surface acoustic wave which propagates on the piezoelectric layer is strongly influenced by elasticity of the substrate. Therefore, when the sound velocity through the substrate material is large, the propagation velocity of the surface acoustic wave is large.

Then, a prototype device comprising a substrate of sapphire through which the sound velocity is large (a velocity of transversal wave: 6000 m/sec., a velocity of longitudinal wave: 12,000 m/sec.) and a ZnO piezoelectric thin film formed thereon was produced. This prototype device achieved the propagation velocity of 5500 m/sec.

Since the sound through diamond has the largest velocity, a surface acoustic wave device comprising a diamond substrate will realize a propagation velocity of 10,000 m/sec. or larger. Since the sound velocity through a diamond-like carbon is substantially the same as that through the diamond, a device comprising the diamond-like carbon substrate will realize the same propagation velocity as in case of the device comprising the diamond substrate. Such device is described in Japanese Patent Application No. 20635/1989.

To provide a surface acoustic wave device, first, an electromechanical coupling factor $K^2$ which is a measure for a conversion efficiency in converting electric energy to mechanical energy should be large. Usually, $K^2$ should be 0.5% or larger. Second, to provide a surface acoustic wave device having a high operation frequency, the propagation velocity v should be large.

When the thin piezoelectric film formed on the substrate is used, the propagation velocity v and the electromechanical coupling factor $K^2$ greatly depend not only on the physical properties of the piezoelectric material and substrate material but also on a film thickness H1 of the piezoelectric film.

When the substrate is in a thin film form, namely the device has a laminate structure of piezoelectric film/substrate film, they depend on a film thickness H2 of the substrate film, too.

However, hitherto, a relationship of the propagation velocity v and the electromechanical coupling factor $K^2$ with the film thicknesses H1 and H2 of the piezoelectric film and the substrate film has not been clarified, when the substrate film is made of diamond.

Therefore, a practical surface acoustic wave device comprising a diamond substrate has not been produced.

SUMMARY OF THE INVENTION

One object of the present invention is to clarify a relationship of the propagation velocity v and the electromechanical coupling factor $K^2$ with the film thicknesses H1 and H2 of the piezoelectric layer and the substrate film in a surface acoustic wave device comprising a substrate film made of diamond.

Another object of the present invention is to provide a surface acoustic wave device which can be used in ultra-high frequency range.

According to the present invention, there is provided a surface acoustic wave device which comprises a diamond or diamond-like carbon layer, a ZnO piezoelectric layer and a comb-like electrode and has a structure having a large surface wave propagation velocity ($v \geq 5500$ m/sec.) and a large electromechanical coupling factor ($K^2 \geq 0.5\%$) which are achieved by defining a thickness of the ZnO layer and a mode.

BRIEF DESCRIPTION OF THE DRAWINGS

FIG. 1 is a plane view of one example of a comb-like electrode,

FIG. 2 is a plane view of another example of a comb-like electrode,

FIGS. 3 to 6 schematically show cross sections of the surface acoustic wave devices of the Types I, II, III and IV, respectively.

DETAILED DESCRIPTION OF THE DRAWINGS

Figure 7:
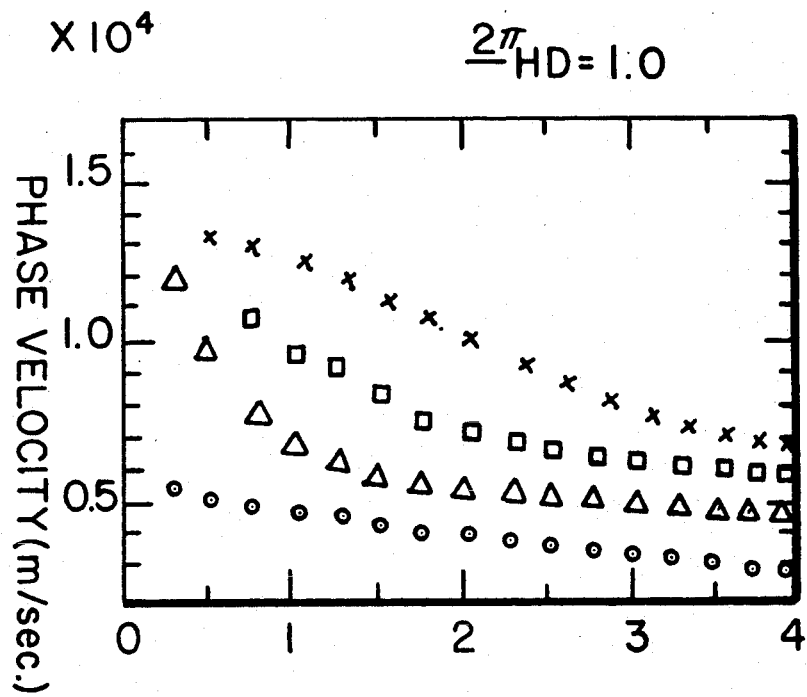
FIGS. 7 to 10 are graphs showing phase velocities which were measured by changing the thickness H of the ZnO layer with using the thickness HD of the diamond layer as a parameter.
Figure 8:
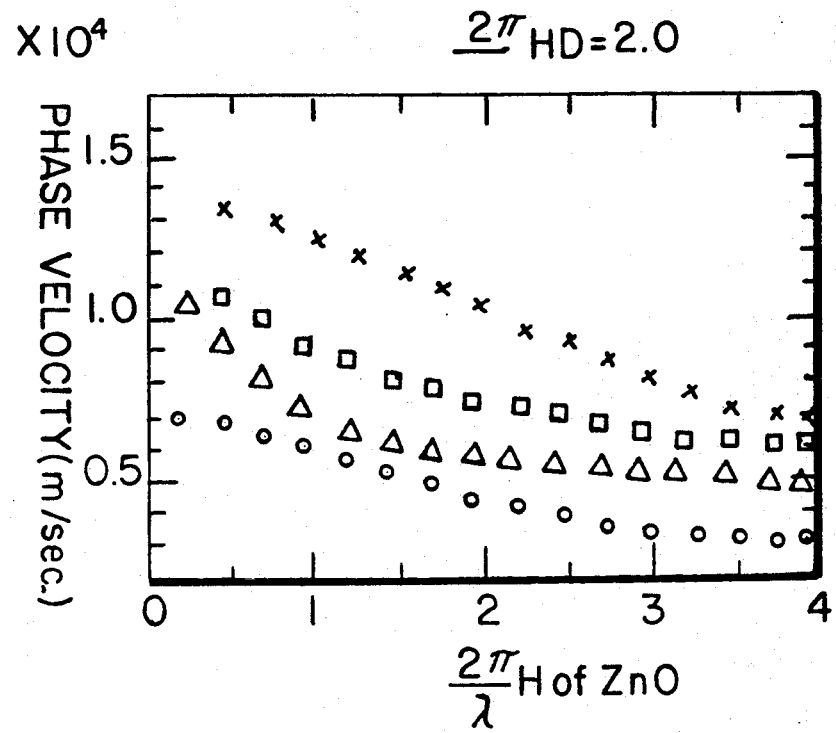
Figure 9:
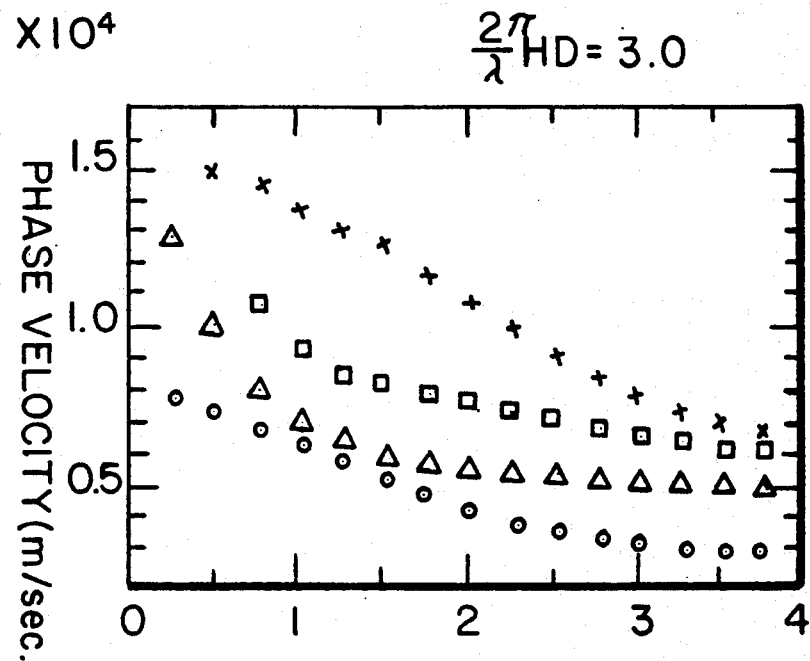
Figure 10:
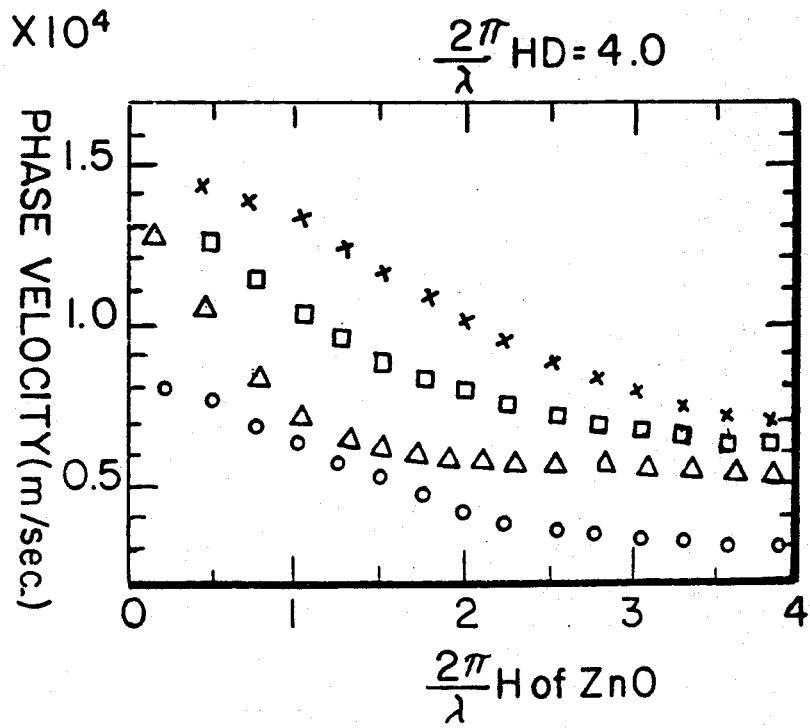
Figure 11:
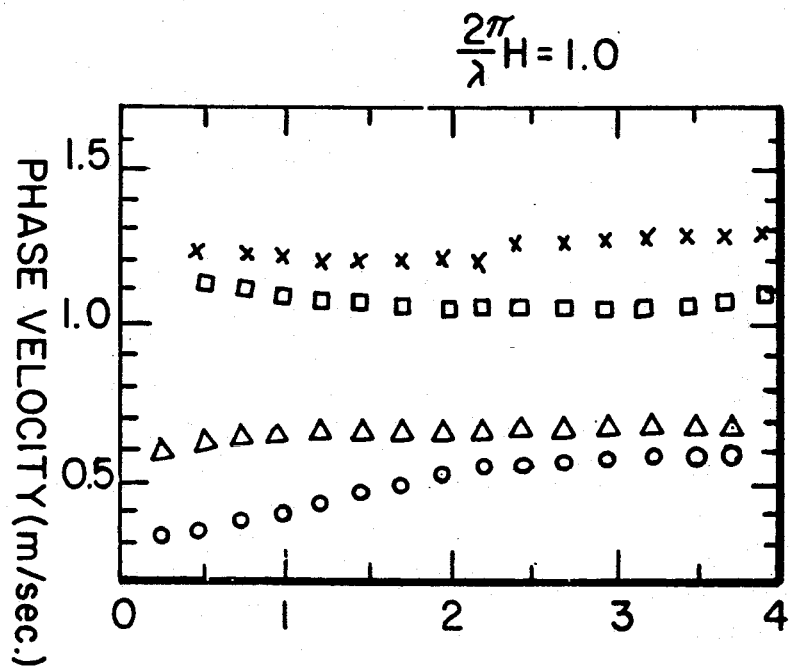
FIGS. 11 to 14 are graphs showing phase velocities which were measured by changing the thickness HD of the diamond layer with using the thickness H of the ZnO layer as a parameter.
Figure 12:
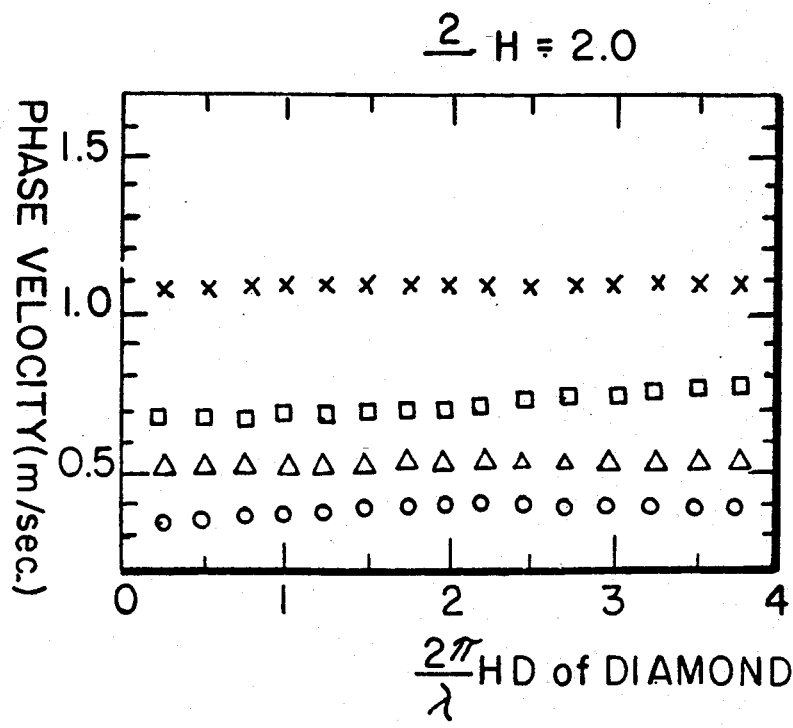
Figure 13:
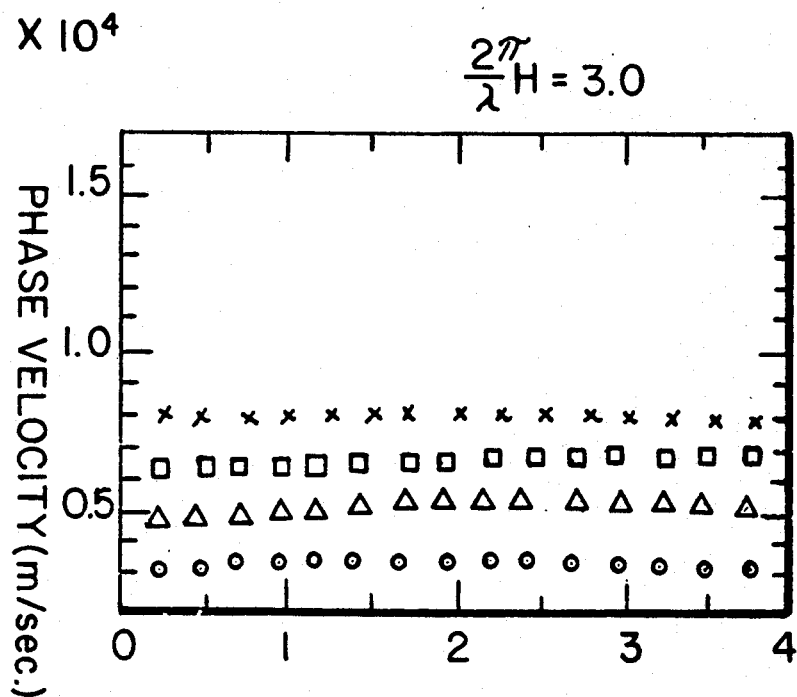
Figure 14:
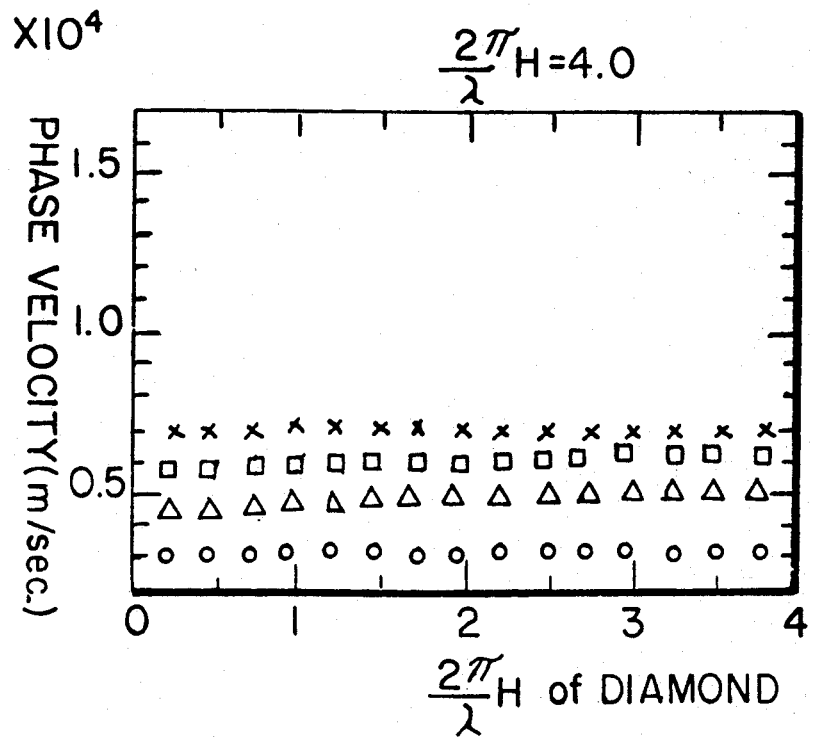

Now, twelve surface acoustic wave devices of the present invention having different conditions and structures will be explained.

In the present invention, a thickness of the ZnO layer is designated by "H" and represented by a parameter "$(2\pi H/\lambda)$", and a thickness of the diamond substrate is designated by "HD" and represented by a parameter "$(2\pi HD/\lambda)$". These parameters are nondimensional parameters.

According to our experiments, it has been found that the propagation velocity v and the electromechanical coupling factor $K^2$ are influenced by ratios of the thicknesses H and HD to the wavelength $\lambda$ rather than their absolute values. Therefore, the conditions are conveniently classified according to the above parameters.

FIGS. 3 to 6 show cross sections of four embodiments of the surface acoustic wave device according to the present invention. The surface acoustic wave devices of FIGS. 3 to 6 are referred to as Types I, II, III and IV, respectively.

FIG. 3 shows Type I, which comprises a silicon substrate 1, a diamond layer 2 formed on the silicon substrate 1, a comb-like electrode 4 formed on the diamond layer 2 and a ZnO layer 3 formed on the electrode 4. This structure corresponds to types (1) to (3) which will be explained below.

FIG. 4 shows Type II, which comprises a silicon substrate 1, a diamond layer 2 formed on the silicon substrate 1, a comb-like electrode 4 formed on the diamond layer 2, a ZnO layer 3 formed on the electrode 4 and further a short-circuit electrode 5 formed on the ZnO layer 3. This structure corresponds to types (4) to (6) which will be explained below.

FIG. 5 shows Type III, which comprises a silicon substrate 1, a diamond layer 2 formed on the silicon substrate 1, a ZnO layer 3 formed on the diamond layer 2 and a comb-like electrode 4 formed on the ZnO layer 3. This structure corresponds to types (7) to (9) which will be explained below.

FIG. 6 shows Type IV, which comprises a silicon substrate 1, a diamond layer 2 formed on the silicon substrate 1, a short-circuit electrode 5 formed on the diamond layer 2, a ZnO layer 3 formed on the short-circuit 5 and a comb-like electrode 4 formed on the ZnO layer 3 This structure corresponds to types (10) to (12) which will be explained below.

Now, the types (1) to (12) will be explained.

Since the explanation will be made by making reference to results of experiments, firstly graphs showing such results are explained.

FIGS. 7 to 10 are graphs showing phase velocities (propagation velocities) which were measured by changing the thickness H of the ZnO layer with using the thickness HD of the diamond layer as a parameter.

When the ZnO layer is thin, the phase velocity is larger due to influence of the diamond layer through which the sound velocity is large.

Circles indicate the zeroth order mode, triangles indicate the first order mode, squares indicate the second order mode, and x's indicate the third order mode. Naturally, at the higher order mode, the phase velocity is larger. However, there is no simple multiple relationship. Among them, there is no material difference due to the difference of structures, that is, difference among Types I, II, III and IV.

FIGS. 11 to 14 are graphs showing phase velocities which were measured by changing the thickness of HD of the diamond layer with using the thickness H of the ZnO layer as a parameter.

When the diamond layer is thick, the phase velocity is larger but does not significantly depends on the thickness of the diamond layer.

Type I

FIGS. 15 to 18 are graphs showing the measured values of the electromechanical coupling factor $K^2$ in Type I.

These graphs does not include the electromechanical coupling factor $K^2$ of the second order mode since they were small.

Figure 15:
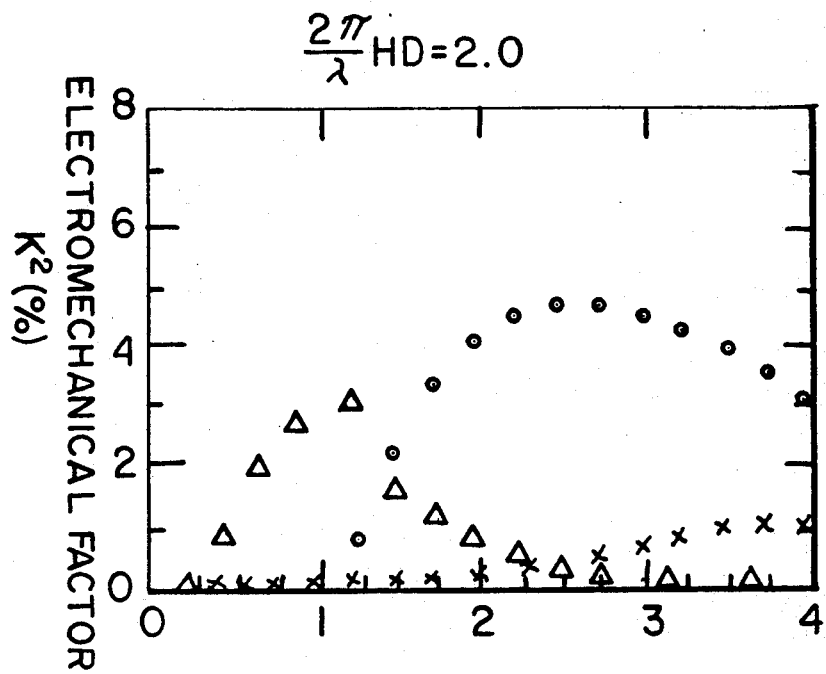
FIGS. 15 to 18 are graphs showing the measured values of the electromechanical coupling factor $K^2$ in Type I.
Figure 16:
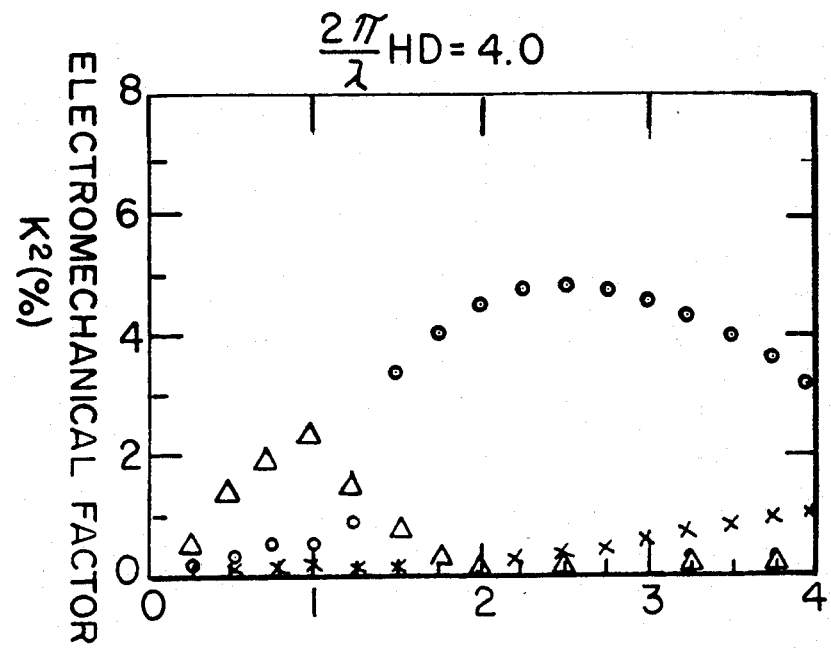

In FIGS. 15 and 16, the parameter was the thickness of the diamond layer, and the measurements were carried out at $2\pi HD/\lambda = 2.0$ and 4.0, respectively.

Figure 17:
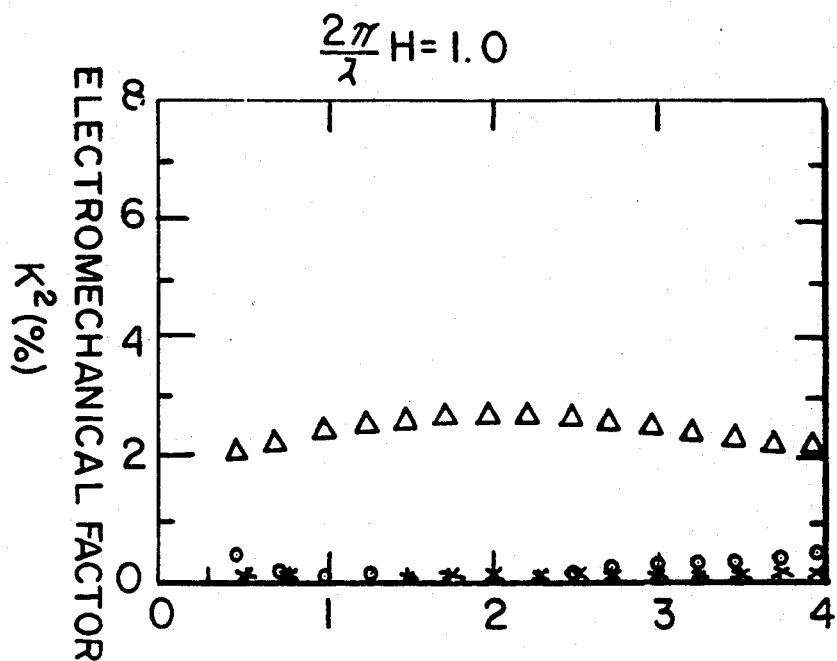
Figure 18:
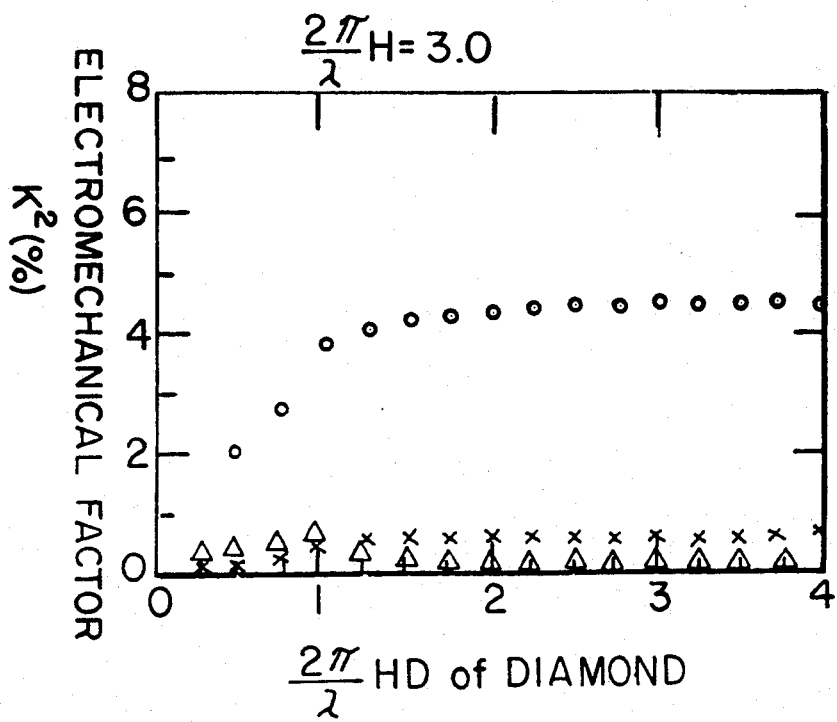

In FIGS. 17 and 18, the parameter was the thickness of the ZnO layer, and the measurements were carried out at $2\pi H/\lambda = 1.0$ and 3.0, respectively.

When $(2\pi H/\lambda)$ is 1 (one), the electromechanical coupling factor $K^2$ of the first order mode is large. As the thickness of the ZnO layer increases, the electromechanical coupling factor $K^2$ of the zeroth order mode tends to increase. If the thickness of the diamond layer varies, the electromechanical coupling factor $K^2$ of the first order mode is large when the thickness of the ZnO layer is small, and the electromechanical coupling factor $K^2$ of the zeroth order mode is larger when the thickness of the ZnO layer is larger.

Type II

FIGS. 19 to 22 are graphs showing the measured values of the electromechanical coupling factor $K^2$ in Type II.

Figure 19:
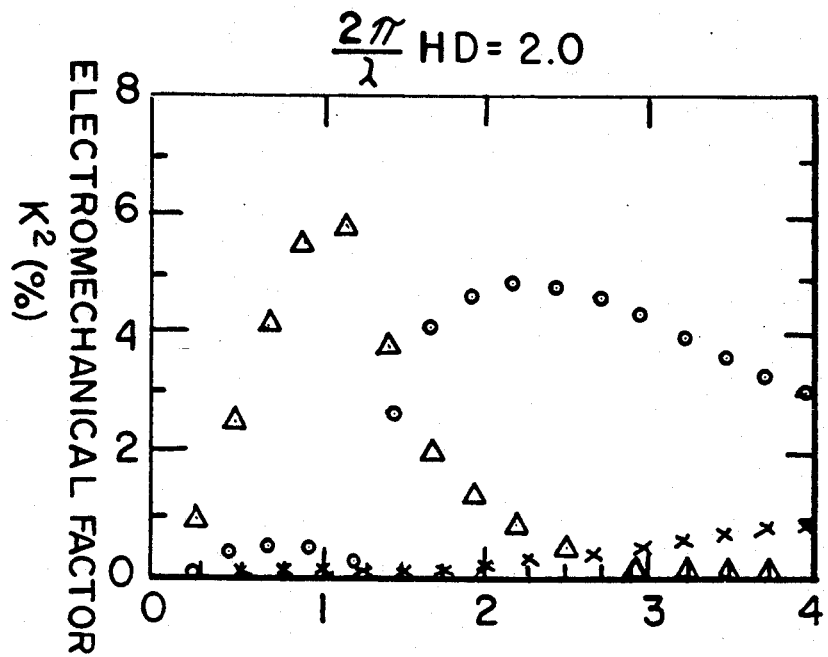
FIGS. 19 to 22 are graphs showing the measured values of the electromechanical coupling factor $K^2$ in Type II.
Figure 20:
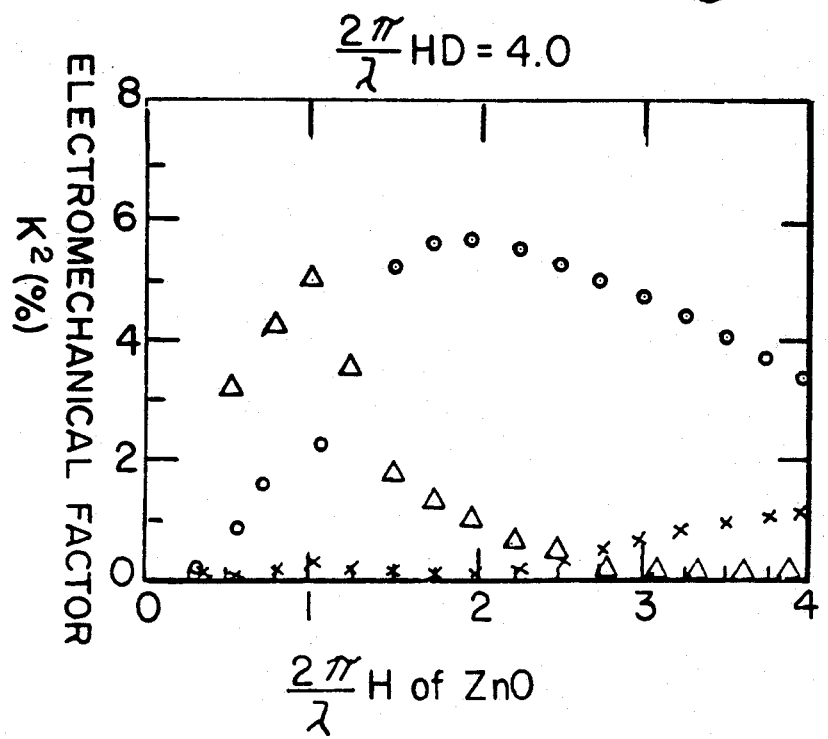

In FIGS. 19 and 20, the parameter was the thickness of the diamond layer, and the measurements were carried out at $2\pi HD/\lambda = 2.0$ and 4.0, respectively.

Figure 21:
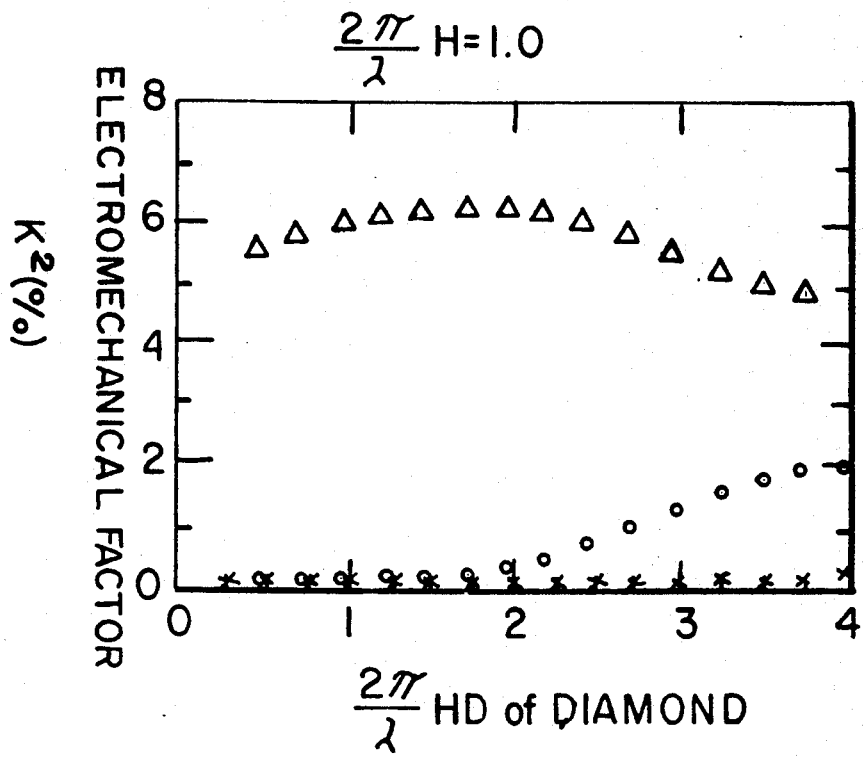
Figure 22:
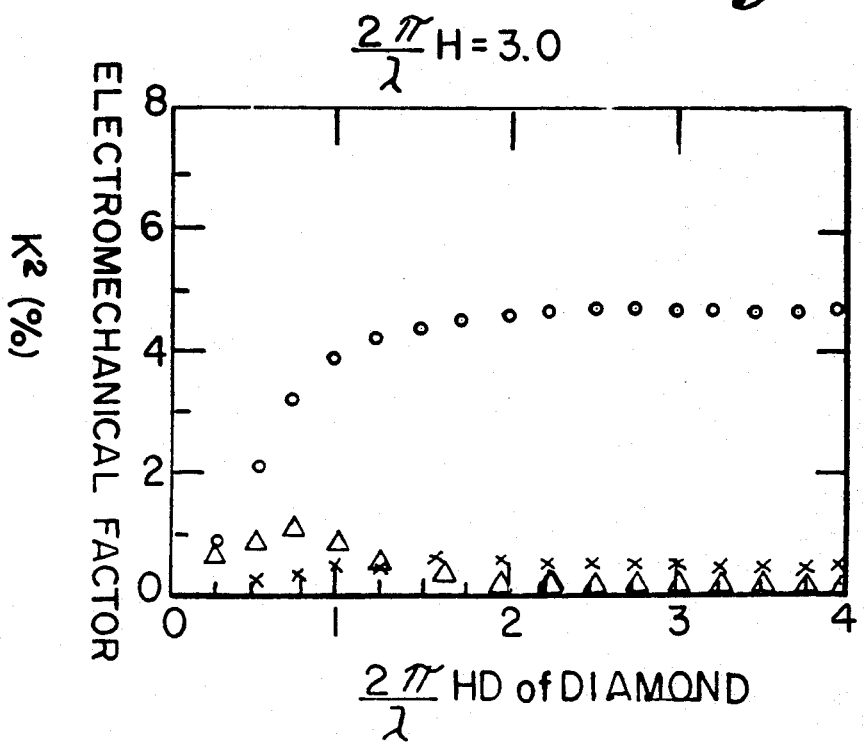

In FIGS. 21 and 22, the parameter was the thickness of the ZnO layer, and the measurements were carried out at $2\pi H/\lambda = 1.0$ and 3.0, respectively.

When $(2\pi H/\lambda)$ is 1 (one), the electromechanical coupling factor $K^2$ of the first order mode is large. As the thickness of the ZnO layer increases, the electromechanical coupling factor $K^2$ of the zeroth order mode tends to increase. If the thickness of the diamond layer varies, the electromechanical coupling factor $K^2$ of the first order mode is large when the thickness of the ZnO layer is small, and the electromechanical coupling factor $K^2$ of the zeroth order mode is larger when the thickness of the ZnO layer is larger.

Types I and II are different only in the presence of the short-circuit electrode. In Type II, the electromechanical coupling factor $K^2$ of the first order mode is larger than in Type I when the thickness of the ZnO layer is thin.

Type III

FIGS. 23 to 26 are graphs showing the measured values of the electromechanical coupling factor $K^2$ in Type III.

Figure 23:
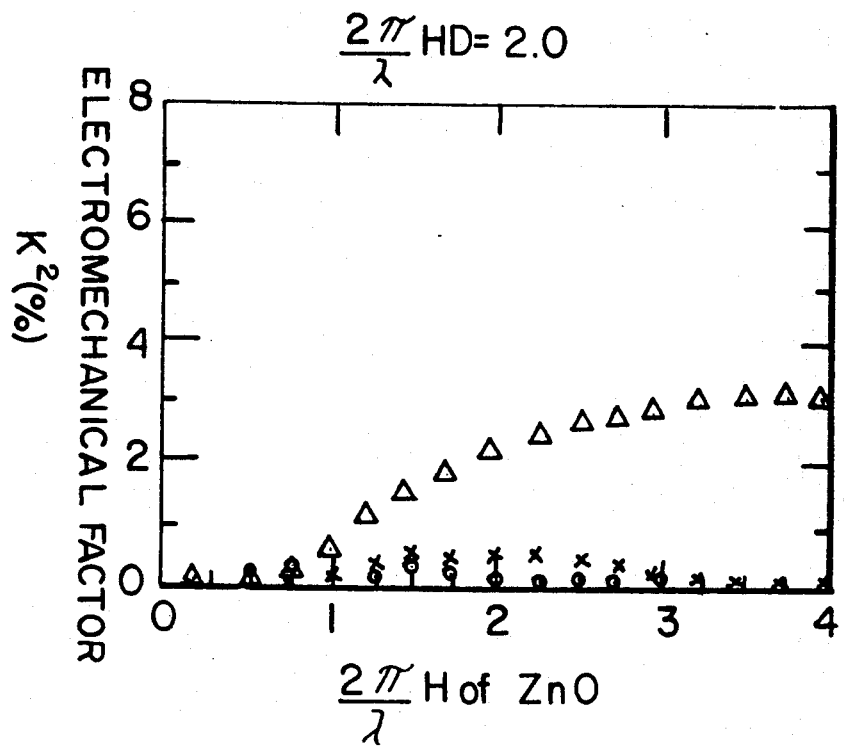
FIGS. 23 to 26 are graphs showing the measured values of the electromechanical coupling factor $K^2$ in Type III.
Figure 24:
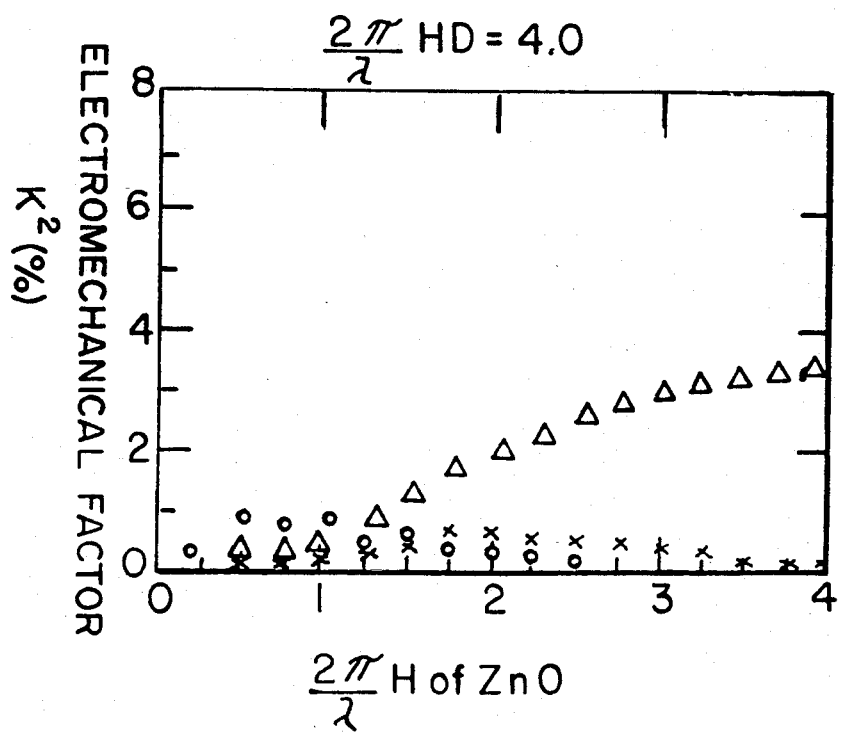

In FIGS. 23 and 24, the parameter was the thickness of the diamond layer, and the measurements were carried out at $2\pi HD/\lambda = 2.0$ and 4.0, respectively.

Figure 25:
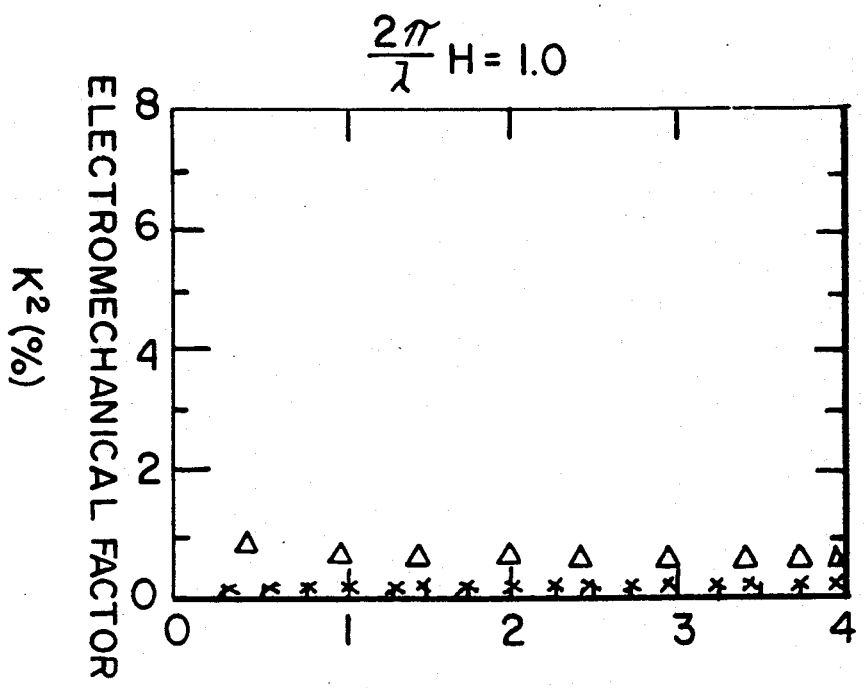
Figure 26:
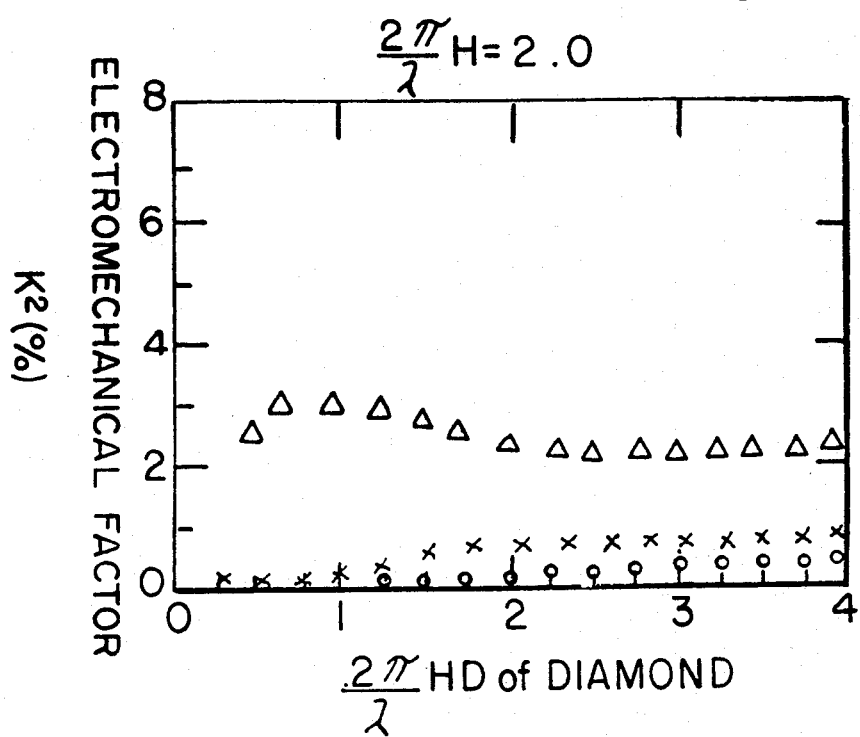

In FIGS. 25 and 26, the parameter was the thickness of the ZnO layer, and the measurements were carried out at $2\pi H/\lambda = 1.0$ and 2.0, respectively.

When the thicknesses of the diamond and ZnO layers are thin, the electromechanical coupling factor $K^2$ is small.

In case of $(2\pi HD/\lambda) = 2$, when the ZnO layer is thick, the first order mode is promising. In case of the thick diamond layer, when the ZnO layer is thin, the electromechanical coupling factor $K^2$ of the zeroth order mode exceed 0.5%, or when the ZnO layer is thick, the electromechanical coupling factor $K^2$ of the third order mode exceed 0.5%.

Type IV

FIGS. 27 to 30 are graphs showing the measured values of the electromechanical coupling factor $K^2$ in Type IV.

Figure 27:
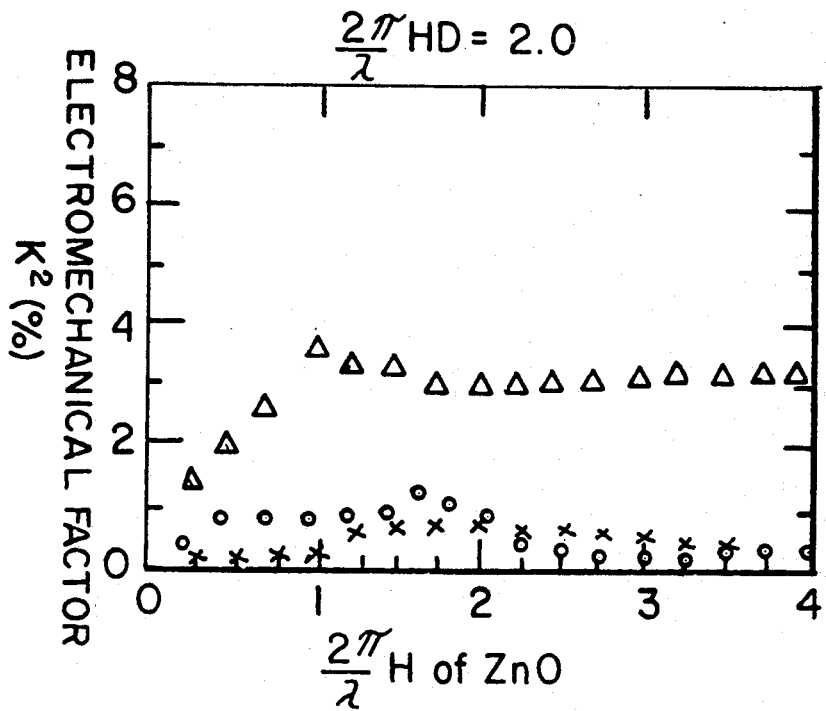
FIGS. 27 to 30 are graphs showing the measured values of the electromechanical coupling factor $K^2$ in Type IV.
Figure 28:
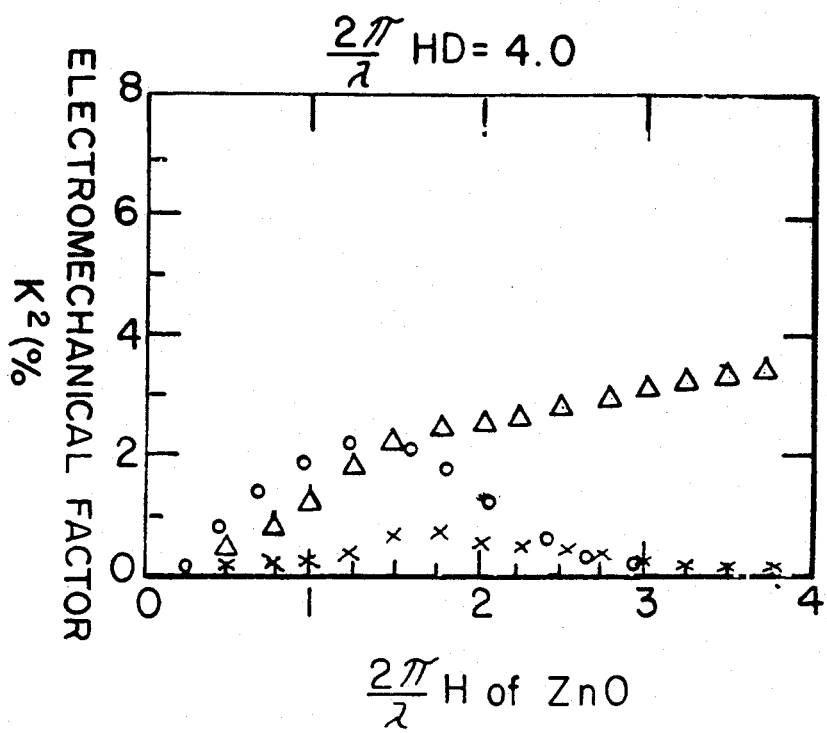

In FIGS. 27 and 28, the parameter was the thickness of the diamond layer, and the measurements were carried out at $(2\pi HD/\lambda) = 2.0$ and 4.0, respectively.

Figures 29, 30:
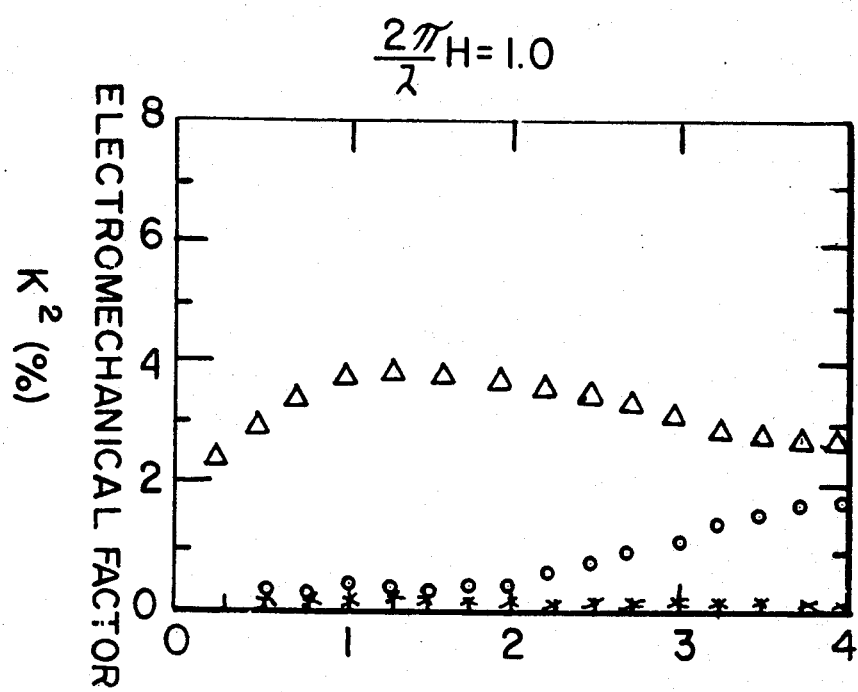

In FIGS. 29 and 30, the parameter was the thickness of the ZnO layer, and the measurements were carried out at $(2\pi H/\lambda) = 1.0$ and 2.0, respectively.

The Type IV further comprises the short-circuit electrode in addition to the elements of the Type III. In a wide range, the electromechanical coupling factor $K^2$ of the first order is large.

As the thickness of the ZnO layer increases, the electromechanical coupling factors $K^2$ of the zeroth and third order modes increase. At $(2\pi HD/\lambda) = 4$, the electromechanical coupling factor $K^2$ of the zeroth order mode exceeds 0.5%, when $(2\pi H/\lambda)$ is from 0.5 to 2.2.

Explanations of the types (1) to (12)

Type I: the types (1), (2) and (3)
Type II: the types (4), (5) and (6)
Type III: the types (7), (8) and (9)
Type IV: the types (10), (11) and (12)

(i) A surface acoustic wave device comprising a diamond or diamond-like carbon layer, a comb-like electrode thereon and a ZnO layer formed on the comb-like electrode, which utilizes a zeroth order mode of a surface acoustic wave which is excited in a structure which satisfies $(2\pi H/\lambda)$ of the ZnO layer = 0.5 – 1.5.

In relation to the propagation velocity v of the surface acoustic wave, preferably $(2\pi H/\lambda)$ is smaller since the propagation velocity v is larger. For example, when $(2\pi H/\lambda)$ is 0.5, the velocity v is from 7000 to 8000 m/sec. In relation to the electromechanical coupling factor $K^2$, preferably $(2\pi H/\lambda)$ is from 1.3 to 1.5 since the factor $K^2$ is 1 to 3%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably $(2\pi HD/\lambda)$ is not smaller than 0.3. When $(2\pi HD/\lambda)$ is larger, the velocity v becomes larger. When $(2\pi HD/\lambda)$ is smaller than 0.3, the velocity v may be less than 5500 m/sec. or the electromechanical coupling factor $K^2$ may be less than 0.5%.

(ii) A surface acoustic wave device comprising a diamond or diamond-like carbon layer, a comb-like electrode thereon and a ZnO layer formed on the comb-like electrode, which utilizes a first order mode of a surface acoustic wave which is excited in a structure which satisfies $(2\pi H/\lambda)$ of the ZnO layer = 0.3–2.0.

In relation to the propagation velocity v of the surface acoustic wave, preferably $(2\pi H/\lambda)$ is smaller since the propagation velocity v is larger. For example, when $(2\pi H/\lambda)$ is from 0.3 to 0.5, the velocity v is from 10,000 to 12,000 m/sec. In relation to the electromechanical coupling factor $K^2$, preferably $(2\pi H/\lambda)$ is from 0.75 to 1.25, since the factor $K^2$ is 1 to 3%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably $(2\pi HD/\lambda)$ is not smaller than 0.5. When $(2\pi HD/\lambda)$ is larger, the velocity v becomes larger. When $(2\pi HD/\lambda)$ is smaller than 0.5, the velocity v may be less than 5500 m/sec.

(iii) A surface acoustic wave device comprising a diamond or diamond-like carbon layer, a comb-like electrode thereon and a ZnO layer formed on the comb-like electrode, which utilizes a third order mode of a surface acoustic wave which is excited in a structure which satisfies ($2\pi H/\lambda$) of the ZnO layer $\geq 2.5$.

In relation to the propagation velocity v of the surface acoustic wave, preferably the ($2\pi H/\lambda$) is smaller since the propagation velocity v is larger. For example, when ($2\pi H/\lambda$) is 2.5, the velocity v is about 10,000 m/sec. In relation to the electromechanical coupling factor $K^2$, preferably ($2\pi H/\lambda$) increases from 2.55 to 4.0 since the factor $K^2$ increases from 0.5 to 1%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller then 0.5. When ($2\pi HD/\lambda$) is smaller than 0.5, the electromechanical coupling factor $K^2$ may be less than 0.5%.

(iv) A surface acoustic wave device comprising a diamond or diamond-like carbon layer, a comb-like electrode thereon, a ZnO layer formed on the comb-like electrode and a short-circuit electrode formed on the ZnO layer, which utilizes a zeroth order mode of a surface acoustic wave which is excited in a structure which satisfies ($2\pi H/\lambda$) of the ZnO layer $= 0.5$-$1.5$.

In relation to the propagation velocity of the surface acoustic wave v, preferably the ($2\pi H/\lambda$) is smaller since the propagation velocity v is larger. For example, when ($2\pi H/\lambda$) is 0.5, the velocity v is from 7000 to 8000 m/sec. In relation to the electromechanical coupling factor $K^2$, preferably ($2\pi H/\lambda$) is from 0.5 to 1.2 or from 1.3 to 1.5 since the factor $K^2$ is 1 to 5%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller than 2.5. When ($2\pi HD/\pi$) is larger, the velocity v becomes larger. When ($2\pi HD/\lambda$) is smaller than 2.5, the electromechanical coupling factor $K^2$ may be less than 0.5%.

(v) A surface acoustic wave device comprising a diamond or diamond-like carbon layer, a comb-like electrode thereon, a ZnO layer formed on the comb-like electrode and a short-circuit electrode formed on the ZnO layer, which utilizes a first order mode of a surface acoustic wave which is excited in a structure which satisfies ($2\pi H/\lambda$) of the ZnO layer $= 0.3$-$2.5$.

In relation to the propagation velocity v of the surface acoustic wave, preferably the ($2\pi H/\lambda$) is smaller since the propagation velocity v is larger. For example, when ($2\pi H/\lambda$) is from 0.3 to 0.5, the velocity v is from 10,000 to 12,000 m/sec. In relation to the electromechanical coupling factor $K^2$, preferably ($2\pi H/\lambda$) is from 0.5 to 1.5 since the factor $K^2$ is 2 to 5%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller then 0.5. When ($2\pi HD/\lambda$) is larger, the velocity v becomes larger. When ($2\pi HD/\lambda$) is smaller than 0.5, the electromechanical coupling factor $K^2$ may be less than 0.5%.

(vi) A surface acoustic wave device comprising a diamond or diamond-like carbon layer, a comb-like electrode thereon, a ZnO layer formed on the comb-like electrode and a short-circuit electrode formed on the ZnO layer, which utilizes a third order mode of a surface acoustic wave which is excited in a structure which satisfies ($2\pi H/\lambda$) of the ZnO layer $\geq 2.5$.

In relation to the propagation velocity v of the surface acoustic wave, preferably the ($2\pi H/\lambda$) is smaller since the propagation velocity v is larger. For example, when ($2\pi H/\lambda$) is 2.5, the velocity v is about 10,000 m/sec. In relation to the electromechanical coupling factor $K^2$, preferably ($2\pi H/\lambda$) increases from 2.5 to 4.0 since the factor $K^2$ increases from 0.5 to 1%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller than 0.5. When ($2\pi HD/\lambda$) is smaller than 0.5, the the propagation velocity may be less than 5500 m/sec.

(vii) A surface acoustic wave device comprising a diamond or diamond-like carbon layer, a ZnO layer formed thereon and a comb-like electrode on the ZnO layer, which utilizes a zeroth order mode of a surface acoustic wave which is excited in a structure which satisfies ($2\pi H/\lambda$) of the ZnO layer $= 0.5$-$1.5$.

In relation to the propagation velocity of the surface acoustic wave v, preferably the ($2\pi H/\lambda$) is smaller since the propagation velocity v is larger. For example, when ($2\pi H/\lambda$) is 0.5, the velocity v is from 7000 to 8000 m/sec. In relation to the electromechanical coupling factor $K^2$, preferably ($2\pi H/\lambda$) is from 1.0 to 1.25 since the factor $K^2$ is 1%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller than 3.0. When ($2\pi HD/\lambda$) is larger, the velocity v becomes larger. When ($2\pi HD/\lambda$) is smaller than 3.0, the propagation velocity v may be less than 5500 m/sec. or the electromechanical coupling factor $K^2$ may be less than 0.5%.

(viii) A surface acoustic wave device comprising a diamond or diamond-like carbon layer, a ZnO layer formed thereon and a comb-like electrode on the ZnO layer, which utilizes a first order mode of a surface acoustic wave which is excited in a structure which satisfies ($2\pi H/\lambda$) of the ZnO layer $= 1.0$-$3.5$.

In relation to the propagation velocity v of the surface acoustic wave, preferably the ($2\pi H/\lambda$) is smaller since the propagation velocity v is larger. For example, when ($2\pi H/\lambda$) is 1.0, the velocity v is from 7000 to 8000 m/sec. In relation to the electromechanical coupling factor $K^2$, preferably ($2\pi H/\lambda$) increases from 1.0 to 3.5 since the factor $K^2$ increases from 0.5 to 3%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller than 2.0. When ($2\pi HD/\lambda$) is larger, the velocity v becomes larger. When ($2\pi HD/\lambda$) is smaller than 2.0, the propagation velocity may be less than 5500 m/sec.

(ix) A surface acoustic wave device comprising a diamond or diamond-like carbon layer, a ZnO layer formed thereon and a comb-like electrode formed on the ZnO layer, which utilizes a third order mode of a surface acoustic wave which is excited in a structure which satisfies ($2\pi H/\lambda$) of the ZnO layer $= 1.5$-$3.0$.

In relation to the propagation velocity v of the surface acoustic wave, preferably the ($2\pi H/\lambda$) is smaller since the propagation velocity v is larger. For example, when ($2\pi H/\lambda$) is 1.5, the velocity v is about 12,000 m/sec.

(x) A surface acoustic wave device comprising a diamond or diamond-like carbon layer, an interfacial short-circuit electrode formed thereon, a ZnO layer formed thereon, and a comb-like electrode formed on the ZnO layer, which utilizes a zeroth order mode of a surface acoustic wave which is excited in a structure which satisfies ($2\pi H/\lambda$) of the ZnO layer=0.5-1.5.

In relation to the propagation velocity of the surface acoustic wave v, preferably the ($2\pi H/\lambda$) is smaller since the propagation velocity v is larger. For example, when ($2\pi H/\lambda$) is 0.5, the velocity v is from 7000 to 8000 m/sec. In relation to the electromechanical coupling factor $K^2$, preferably ($2\pi H/\lambda$) increases from 0.5 to 1.5 since the factor $K^2$ increases from 0.5 to 3%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller then 3.0. When ($2\pi HD/\lambda$) is larger, the velocity v becomes larger. When ($2\pi HD/\lambda$) is smaller than 3.0, the propagation velocity may be less than 5500 m/sec. When ($2\pi H/\lambda$) is larger, the electromechanical coupling factor $K^2$ becomes larger. When ($2\pi H/\lambda$) is less than 3.0 the factor $K^2$ may be less than 0.5%.

(xi) A surface acoustic wave device comprising a diamond or diamond-like carbon layer, an interfacial short-circuit electrode formed thereon, a ZnO layer formed thereon and a comb-like electrode formed on the ZnO layer, which utilizes a first order mode of a surface acoustic wave which is excited in a structure which satisfies ($2\pi H/\lambda$) of the ZnO layer=0.5-3.5.

In relation to the propagation velocity v of the surface acoustic wave, preferably the ($2\pi H/\lambda$) is smaller since the propagation velocity v is larger. For example, when ($2\pi H/\lambda$) is 0.5, the velocity v is about 10,000 m/sec. In relation to the electromechanical coupling factor $K^2$, preferably ($2\pi H/\lambda$) increases from 0.5 to 3.5 since the factor $K^2$ increases from 0.5 to 3%.

The diamond layer may be made of any of a natural diamond, a single crystal diamond produced by ultra-high pressure synthesis and a film-form diamond produced by the vapor phase deposition. When the film-form diamond or the diamond-like carbon layer is used, preferably ($2\pi HD/\lambda$) is not smaller then 2 0. When ($2\pi HD/\lambda$) is larger, the velocity v becomes larger. When ($2\pi HD/\lambda$) is smaller than 2.0, the propagation velocity may be less than 5500 m/sec.

(xii) A surface acoustic wave device comprising a diamond or diamond-like carbon layer, an interfacial short-circuit electrode formed thereon, a ZnO layer formed thereon and a comb-like electrode formed the ZnO layer, which utilizes a third order mode of a surface acoustic wave which is excited in a structure which satisfies ($2\pi H/\lambda$) of the ZnO layer=1.5-3.0.

In relation to the propagation velocity v of the surface acoustic wave, preferably the ($2\pi H/\lambda$) is smaller since the propagation velocity v is larger. For example, when ($2\pi H/\lambda$) is 1.5, the velocity v is about 12,000 m/sec.

Each of the surface acoustic wave devices which are produced under the above conditions and function in the determined mode has the large propagation velocity v and also the large electromechanical coupling factor $K^2$.

In all of the types (1) to (12), when ($2\pi HD/\lambda$) is not smaller than 4.0, both the propagation velocity v and the electromechanical coupling factor $K^2$ do not depend on ($2\pi HD/\lambda$), and the devices comprising the diamond layer of the single crystal diamond fall in this range.

The diamond layer or the diamond-like carbon layer can be formed on a substrate such as glass, silicon or a metal by the vapor phase deposition from a suitable gaseous raw material such as hydrocarbons. The vapor phase deposition can be carried out by 1) activating the raw material gas by heating an electron radiation material, 2) decomposing and exciting the gas with plasma, 3) decomposing and exciting the gas with light, 4) growing the diamond or the diamond-like carbon through ion bombardment, and 5) burning the gas.

The devices of the types (1) to (12) have substantially the same characteristics when the diamond layer or the diamond-like carbon layer is formed on a substrate made of a semiconductive material such as silicon, a metal, a glass, a ceramic, an oxide or a nitride. With any of the substrate material, the preferred value of ($2\pi H/\lambda$) is similar.

When the comb-like electrode is formed on the diamond layer or the diamond-like carbon layer in the types of (1) to (6), the layer should be electrically insulating and its resistivity should be at least $10^7$ ohm.cm, preferably at least $10^9$ ohm.cm.

Preferably, the diamond layer or the diamond-like carbon layer has a smooth surface, and is optionally surface polished.

The ZnO layer can be grown to have good orientation in the c axis and a large piezoelectric property by the spattering method, or the vapor phase deposition such as the CVD method.

When the orientation in the c axis is too small or the resistivity of the ZnO layer is too small, the electromechanical coupling factor $K^2$ becomes too small. Then, preferably, a $\sigma$ value (a degree of orientation calculated from an X-ray rocking curve against the c axis of ZnO) is not larger than 3°, and the resistivity is not smaller than $10^5$ ohm.cm.

The comb-like electrode can be formed from a metal such as aluminum by conventional photolithography to have a line width of as small as 1.2 $\mu$m. As the line width is reduced, a frequency f becomes large. For example, when the line width is 1.2 $\mu$m, $\lambda$ is 4.8 $\mu$m and v is 10,000 m/sec., a high frequency wave having a frequency of 2.08 GHz can be generated.

By using the electron beam exposure technique, a finer patterning can be achieved, so that the operating frequency can be further increased.

EXAMPLES

Four surface acoustic wave filters having the structures of FIGS. 3 to 6, respectively were produced with varying the thicknesses of the ZnO film and the diamond film. The filter characteristics of the produced surface acoustic wave filters were measured, and $v=f/\lambda$ was calculated from the center frequency f. From the measurement of radiation impedance of the comb-like electrode, the electromechanical coupling factor $K^2$ was determined.

The diamond layer was grown on the polycrystal silicon (12 mm square) by the microwave plasma CVD method under the following conditions:

Raw material gas: CH$_4$/H$_2$=1/100
Power of microwave: 400 W
Reaction pressure: 50 Torr.

After growing of the diamond layer, its surface was polished to a predetermined thickness between 0.5 and 5 μm. Each diamond layer had a resistivity larger than 10$^9$ ohm.cm.

The ZnO layer was formed by the RF magnetostron spattering method under the following conditions:
Substrate temperature: 400° C.
Spattering gas: Ar/O$_2$=1/1
RF power: 150 W
Pressure 0.01 Torr.

With varying the spattering time, the thickness of the ZnO layer was adjusted to the predetermined thickness between 0.5 and 5 μm. Each ZnO layer had 1.8 to 2.1 of the α value in the X-ray rocking curve, this indicated that the ZnO layer had good orientation in the c axis.

The comb-like electrode and the short circuit electrode were formed from aluminum by vacuum deposition.

Two pairs of the comb-like electrodes having the type of FIG. 2 were formed by the conventional photolithography.

The line width was 2 μm (corresponding to λ=8 μm), and the number of the electrode pairs was 25.

The propagation velocity and the electromechanical coupling factor K$^2$ were shown in FIGS. 7 to 30.

From the results, it is confirmed that the types (1) to (12) can realize the filters which utilizes the surface acoustic wave having the propagation velocity of not smaller than 5500 m/sec. and the electromechanical coupling factor K$^2$ of not smaller than 0.5%.

The surface acoustic wave device of the present invention can be used as the filter and also as a resonator, a delay line, a signal processing device or a convolver.

What is claimed is:

1. A surface acoustic wave device comprising a diamond or diamond-like carbon layer, a comb-like electrode thereon and a ZnO layer formed on the comb-like electrode, which utilizes a zeroth order mode of a surface acoustic wave which is excited in a structure which satisfies (2πH/λ) of the ZnO layer=0.5–1.5, wherein H is a thickness of the ZnO layer and λ is a wavelength of the surface acoustic wave.

2. A surface acoustic wave device comprising a diamond or diamond-like carbon layer, a comb-like electrode thereon and a ZnO layer formed on the comb-like electrode, which utilizes a first order mode of a surface acoustic wave which is excited in a structure which satisfies (2πH/λ) of the ZnO layer=0.3–2.0, wherein H is a thickness of the ZnO layer and λ is a wavelength of the surface acoustic wave.

3. A surface acoustic wave device comprising a diamond or diamond-like carbon layer, a comb-like electrode thereon and a ZnO layer formed on the comb-like electrode, which utilizes a third order mode of a surface acoustic wave which is excited in a structure which satisfies (2πH/λ) of the ZnO layer≧2.5, wherein H is a thickness of the ZnO layer and λ is a wavelength of the surface acoustic wave.

4. A surface acoustic wave device comprising a diamond or diamond-like carbon layer, a comb-like electrode thereon, a ZnO layer formed on the comb-like electrode and a short-circuit electrode formed on the ZnO layer, which utilizes a zeroth order mode of a surface acoustic wave which is excited in a structure which satisfies (2πH/λ) of the ZnO layer=0.5–1.5, wherein H is a thickness of the ZnO layer and λ is a wavelength of the surface acoustic wave.

5. A surface acoustic wave device comprising a diamond or diamond-like carbon layer, a comb-like electrode thereon, a ZnO layer formed on the comb-like electrode and a short-circuit electrode formed on the ZnO layer, which utilizes a first order mode of a surface acoustic wave which is excited in a structure which satisfies (2πH/λ) of the ZnO layer=0.3–2.5, wherein H is a thickness of the ZnO layer and λ is a wavelength of the surface acoustic wave.

6. A surface acoustic wave device comprising a diamond or diamond-like carbon layer, a comb-like electrode thereon, a ZnO layer formed on the comb-like electrode and a short-circuit electrode formed on the ZnO layer, which utilizes a third order mode of a surface acoustic wave which is excited in a structure which satisfies (2πH/λ) of the ZnO layer≧2.5, wherein H is a thickness of the ZnO layer and λ is a wavelength of the surface acoustic wave.

7. A surface acoustic wave device comprising a diamond or diamond-like carbon layer, a ZnO layer formed thereon and a comb-like electrode on the ZnO layer, which utilizes a zeroth order mode of a surface acoustic wave which is excited in a structure which satisfies (2πH/λ) of the ZnO layer=0.5–1.5, wherein H is a thickness of the ZnO layer and λ is a wavelength of the surface acoustic wave.

8. A surface acoustic wave device comprising a diamond or diamond-like carbon layer, a ZnO layer formed thereon and a comb-like electrode on the ZnO layer, which utilizes a first order mode of a surface acoustic wave which is excited in a structure which satisfies (2πH/λ) of the ZnO layer=1.0–3.5, wherein H is a thickness of the ZnO layer and λ is a wavelength of the surface acoustic wave.

9. A surface acoustic wave device comprising a diamond or diamond-like carbon layer, a ZnO layer formed thereon and a comb-like electrode formed on the ZnO layer, which utilizes a third order mode of a surface acoustic wave which is excited in a structure which satisfies (2πH/λ) of the ZnO layer=1.0–3.0, wherein H is a thickness of the ZnO layer and λ is a wavelength of the surface acoustic wave.

10. A surface acoustic wave device comprising a diamond or diamond-like carbon layer, an interfacial short-circuit electrode formed thereon, a ZnO layer formed thereon, and a comb-like electrode formed on the ZnO layer, which utilizes a zeroth order mode of a surface acoustic wave which is excited in a structure which satisfies (2πH/λ) of the ZnO layer=0.5–1.5, wherein H is a thickness of the ZnO layer and λ is a wavelength of the surface acoustic wave.

11. A surface acoustic wave device comprising a diamond or diamond-like carbon layer, an interfacial short-circuit electrode formed thereon, a ZnO layer formed thereon and a comb-like electrode formed on the ZnO layer, which utilizes a first order mode of a surface acoustic wave which is excited in a structure which satisfies (2πH/λ) of the ZnO layer=0.5–3.5, wherein H is a thickness of the ZnO layer and λ is a wavelength of the surface acoustic wave.

12. A surface acoustic wave device comprising a diamond or diamond-like carbon layer, an interfacial short-circuit electrode formed thereon, a ZnO layer formed thereon and a comb-like electrode formed the ZnO layer, which utilizes a third order mode of a surface acoustic wave which is excited in a structure which satisfies (2πH/λ) of the ZnO layer=1.0–3.0, wherein H is a thickness of the ZnO layer and λ is a wavelength of the surface acoustic wave.

* * * * *